(12) United States Patent
Magdefrau et al.

(10) Patent No.: US 9,765,455 B2
(45) Date of Patent: Sep. 19, 2017

(54) METHOD OF DESIZING FIBER

(71) Applicant: United Technologies Corporation, Hartford, CT (US)

(72) Inventors: Neal Magdefrau, Tolland, CT (US); Paul Sheedy, Bolton, CT (US); Tania Bhatia Kashyap, West Hartford, CT (US)

(73) Assignee: United Technologies Corporation, Farmington, CT (US)

( * ) Notice: Subject to any disclaimer, the term of this patent is extended or adjusted under 35 U.S.C. 154(b) by 506 days.

(21) Appl. No.: 14/595,294

(22) Filed: Jan. 13, 2015

(65) Prior Publication Data

US 2016/0305048 A1 Oct. 20, 2016

Related U.S. Application Data

(60) Provisional application No. 61/933,896, filed on Jan. 31, 2014.

(51) Int. Cl.

| | |
|---|---|
| *D02J 3/00* | (2006.01) |
| *C04B 35/622* | (2006.01) |
| *C04B 35/628* | (2006.01) |
| *D02J 13/00* | (2006.01) |
| *C23C 16/26* | (2006.01) |
| *C23C 16/32* | (2006.01) |
| *C23C 16/34* | (2006.01) |
| *C23C 16/00* | (2006.01) |

(Continued)

(52) U.S. Cl.
CPC ............ *D02J 3/00* (2013.01); *C04B 35/6286* (2013.01); *C04B 35/62863* (2013.01); *C04B 35/62868* (2013.01); *C04B 35/62871* (2013.01); *C04B 35/62873* (2013.01); *C04B 35/62884* (2013.01); *C04B 35/62894* (2013.01); *C04B 35/80* (2013.01); *C04B 35/82* (2013.01); *C23C 16/00* (2013.01); *C23C 16/26* (2013.01); *C23C 16/32* (2013.01); *C23C 16/325* (2013.01); *C23C 16/342* (2013.01); *C23C 16/345* (2013.01); *D02J 13/00* (2013.01); *D06L 1/14* (2013.01); *C04B 2235/524* (2013.01); *C04B 2235/5224* (2013.01); *C04B 2235/5228* (2013.01); *C04B 2235/5236* (2013.01); *C04B 2235/5244* (2013.01); *C04B 2235/5256* (2013.01); *C04B 2235/5264* (2013.01); *F01D 5/282* (2013.01); *F01D 9/02* (2013.01); *F01D 11/08* (2013.01); *F05D 2220/32* (2013.01); *F05D 2230/314* (2013.01); *F05D 2230/90* (2013.01); *F05D 2300/6033* (2013.01); *F05D 2300/614* (2013.01)

(58) Field of Classification Search
None
See application file for complete search history.

(56) References Cited

U.S. PATENT DOCUMENTS

| | | | |
|---|---|---|---|
| 4,328,136 A | 5/1982 | Blount | |
| 5,407,740 A * | 4/1995 | Jessen | C04B 35/80 |
| | | | 428/300.1 |

(Continued)

*Primary Examiner* — Joseph Miller, Jr.
(74) *Attorney, Agent, or Firm* — Carlson, Gaskey & Olds, PC

(57) ABSTRACT

A method of preparing a fiber for use in forming a ceramic matrix composite material comprises the steps of removing a polymer coating from an outer surface of glass or ceramic fibers by providing heated and humidified gas across the glass or ceramic fibers for a period of time.

20 Claims, 1 Drawing Sheet

(51) Int. Cl.
    *C04B 35/80*    (2006.01)
    *C04B 35/82*    (2006.01)
    *D06L 1/14*     (2006.01)
    F01D 5/28       (2006.01)
    F01D 9/02       (2006.01)
    F01D 11/08      (2006.01)

(56) References Cited

U.S. PATENT DOCUMENTS

| | | |
|---|---|---|
| 7,754,054 B2 | 7/2010 | Mitra et al. |
| 2003/0008067 A1* | 1/2003 | Yamaguchi ............ C04B 35/571 |
| | | 427/249.15 |
| 2006/0147692 A1* | 7/2006 | Kmetz .............. C04B 35/62868 |
| | | 428/292.1 |

* cited by examiner

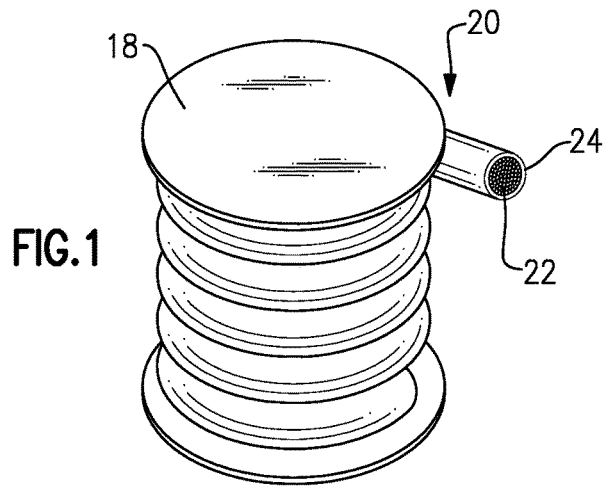
FIG.1
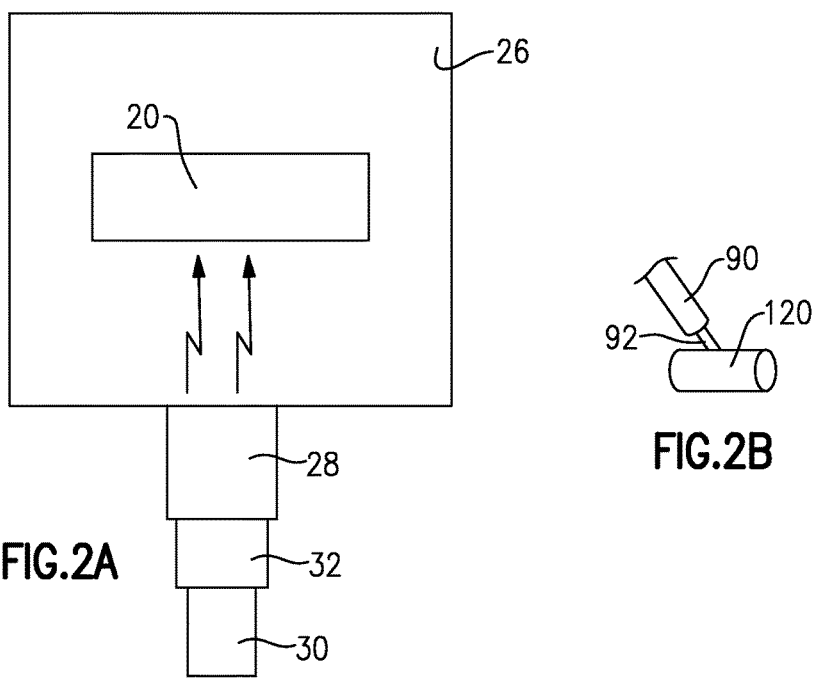
FIG.2A
FIG.2B
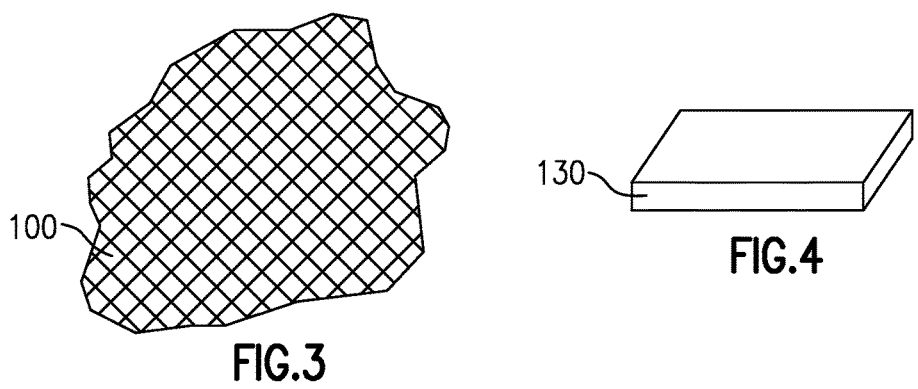
FIG.3
FIG.4

METHOD OF DESIZING FIBER

CROSS-REFERENCE TO RELATED APPLICATION

This application claims priority to U.S. Provisional Patent Application No. 61/933,896, filed Jan. 31, 2014.

BACKGROUND OF THE INVENTION

This application relates to a method of desizing or removing an intermediate coating from ceramic or glass fibers.

Ceramic and glass fibers are utilized in the formation of ceramic matrix composite ("CMC") materials. CMC materials are finding applications in any number of high temperature applications. As an example, gas turbine engines may incorporate a number of components formed of CMC materials.

The CMC materials are formed from ceramic or glass fibers, such as silicon carbide ("SiC") fibers. In the formation of CMC materials, the diameter of the fibers may be between 5 and 150 microns. Such fibers are provided with a polymeric coating, also called a sizing, which prevents fiber breakage and damage during handling after production. However, in the process of making the CMC materials, it is often desirable to coat the SiC fibers with one or more fiber interface coatings. As an example, an interface coating such as boron nitride on a SiC fiber provides for a weak interface in the CMC material which deflect cracks and provides toughness in the material. Outwardly of this coating, there could also be another coating such as silicon nitride, silicon carbide, boron carbide, carbon, or combinations thereof, which improves the environmental durability of the underlying boron nitride coating.

Prior to application of the interface coating or coatings, the polymer sizing on the fibers must be removed, or desized.

Traditionally, the desizing of fibers such as SiC has been provided by using a high temperature ammonia heat treatment. In some instances, other methods such as passing the fibers through a flame have also been used to burn off the polymer coating and desize the fiber. For textile sizes and applications, hot water treatments have also been utilized.

SUMMARY OF THE INVENTION

In a featured embodiment, a method of preparing a fiber for use in forming a ceramic matrix composite material comprises the steps of removing a polymer coating from an outer surface of glass or ceramic fibers by providing heated and humidified gas across the glass or ceramic fibers for a period of time.

In another embodiment according to the previous embodiment, the glass or ceramic fibers have a diameter of greater than or equal to 5 micron and less than or equal to 150 micron.

In another embodiment according to any of the previous embodiments, the gas is heated to a temperature between 20 and 900° C.

In another embodiment according to any of the previous embodiments, the gas is heated to between 300 and 500° C.

In another embodiment according to any of the previous embodiments, the gas is air.

In another embodiment according to any of the previous embodiments, the glass or ceramic fibers include bundled fibers provided with polymer coating on the outer surface.

In another embodiment according to any of the previous embodiments, the bundled fibers are provided with a subsequent interface coating after having the polymer coating removed.

In another embodiment according to any of the previous embodiments, the subsequent interface coating is provided by a chemical vapor deposition process.

In another embodiment according to any of the previous embodiments, the subsequent interface coating includes at least one inner layer and an outer layer.

In another embodiment according to any of the previous embodiments, the at least one inner layer of the interface coating is boron nitride.

In another embodiment according to any of the previous embodiments, the outer layer of the interface coating is one of silicon nitride, silicon carbide, boron carbide, carbon, and combinations thereof.

In another embodiment according to any of the previous embodiments, the glass or ceramic fibers are woven into fabric prior to the polymer coating removal step.

In another embodiment according to any of the previous embodiments, the gas is heated to between 300 and 500° C.

In another embodiment according to any of the previous embodiments, the gas is air.

In another embodiment according to any of the previous embodiments, the gas is air.

In another embodiment according to any of the previous embodiments, the glass or ceramic fibers include bundled fibers provided with the polymer coating on the outer surface.

In another embodiment according to any of the previous embodiments, the bundled fibers are provided with a subsequent interface coating after having the polymer coating removed.

In another embodiment according to any of the previous embodiments, the subsequent interface coating is provided by a chemical vapor deposition process.

In another embodiment according to any of the previous embodiments, the subsequent interface coating includes at least one inner layer and an outer layer.

In another embodiment according to any of the previous embodiments, the coated fibers are utilized to form a component for a gas turbine engine.

These and other features may be best understood from the following drawings and specification.

BRIEF DESCRIPTION OF THE DRAWINGS

FIG. 1 shows a raw fiber as may be produced.
FIG. 2A shows a step in desizing.
FIG. 2B shows a subsequent coating step.
FIG. 3 shows an intermediate product.
FIG. 4 schematically shows a final product.

DETAILED DESCRIPTION

FIG. 1 shows a spool 18 that may carry a bundled fiber or fiber tow 20, which may be composed of Si—C, Si—C—O, Si—C—N—O, Si—B—C—N, Si—N, boron carbide, aluminium oxide, mullite, zirconia, alumina-silicate glass, and combinations thereof. Examples of such SiC fibers are available under the trade names Hi-Nicalon™ and Hi-Nicalon type S™. Such fibers may be available from Nippon Carbon Co, Ltd. ("NCK") of Japan. The site of the bundled fibers 20 is greatly exaggerated relative to the size of spool 18, to better illustrate the details of the bundled fibers 20. As mentioned, this disclosure extends to glass or ceramic fibers generally.

As shown, a number of fibers 22 may be bundled within fiber tow, 20. Such fibers, when utilized to form CMC materials, may be greater than or equal to 5 and less than or equal to 150 microns in diameter. An outer coating 24 is provided about an outer surface of the bundled fibers. The outer coating 24 may be a polymer coating such as a polyvinyl alcohol coating. This coating is provided to protect the fibers during handling and prevent damage and breakage.

However, subsequent coatings are required and the polymer coating must be removed prior to the subsequent coating.

Thus, as shown in FIG. 2A, the fiber 20 is placed in a chamber 26 which is exposed to air 30 which is heated and passed through a source of water such as humidifier 32, such that the combined humidified air entering chamber 26 and passes an inlet 28 and across the fibers 20 to desize the polymer coating from the bundled fiber 20.

The air entering the chamber 26 may be between 20 and 900° C. More narrowly, it may be between 300 and 500° C.

The fiber 20 may be exposed to the process of FIG. 2A for a time on the order of one to three hours. The flow rate of water in the humidified air may be on the order of 1 to 20 ml per minute. The humidifier 32 may require that air be bubbled through a water bubbler.

In another embodiment, the chamber is fed air or inert gas which is passed through a water vaporizer or steam generator.

While air is disclosed, other carrier gases, such as helium, argon or nitrogen, carbon dioxide, carbon monoxide, ammonia, or combinations thereof may be utilized.

Once the polymer sizing has been removed, a subsequent interface coating may be applied by tool 90, such as coating 92, as shown in FIG. 2B. This interface coating is applied to the bundled fibers 120 which have now had the polymer sizing removed. Such interface coatings may be known and may be provided by a chemical vapor deposition process, as shown schematically at 90. The interface coatings may include an inner layer of boron nitride and an outer layer of silicon nitride, silicon carbide, boron carbide, carbon, or combinations thereof. The coatings themselves are as known, however, to make these coatings, the polymer sizing must first be successfully removed.

While a particular process is disclosed in FIG. 2A, the polymer sizing may also be removed by soaking the fibers in boiling de-ionized water along with air or other gases.

Once the fibers have been desized and coated with an appropriate interface coating or coatings, they may be utilized in any known process to form an intermediate product 100. As an example, the intermediate product 100 may be a pre-preg tape, such that a subsequent and final CMC component 130 is formed. In other examples, the fiber or fiber tows may first be woven into a fabric prior to desizing (that is, the polymer coating removal step), then desized and coated with appropriate interface coatings to form the intermediate product 100. This intermediate product 100 may be subsequently utilized in a polymer infiltration and pyrolysis and/or slurry cast melt infiltration process to form the final CMC component 130. The component 130 formed in these ways may be for use in a gas turbine engine, in one example, and could be a turbine blade, vane, blade outer air seal, combustor liner, etc.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A method of preparing a fiber for use in forming a ceramic matrix composite material comprising the steps of:
   removing a polymer coating from an outer surface of glass or ceramic fibers by providing heated and humidified gas across said glass or ceramic fibers for a period of time; and
   wherein said gas is initially heated, and then passed through a source of water prior to being passed across said glass or ceramic fibers.

2. The method as set forth in claim 1, wherein said glass or ceramic fibers have a diameter of greater than or equal to 5 micron and less than or equal to 150 micron.

3. The method as set forth in claim 2, wherein said gas is heated to a temperature between 20 and 900° C.

4. The method as set forth in claim 3, wherein said gas is heated to between 300 and 500° C.

5. The method as set forth in claim 4, wherein said gas is air.

6. The method as set forth in claim 4, wherein said glass or ceramic fibers include bundled fibers provided with polymer coating on the outer surface.

7. The method as set forth in claim 6, wherein said bundled fibers are provided with a subsequent interface coating after having the polymer coating removed.

8. The method as set forth in claim 7, wherein said subsequent interface coating is provided by a chemical vapor deposition process.

9. The method as set forth in claim 7, wherein said subsequent interface coating includes at least one inner layer and an outer layer.

10. The method as set forth in claim 9, wherein said at least one inner layer of the interface coating is boron nitride.

11. The method as set forth in claim 9, wherein said outer layer of the interface coating is one of silicon nitride, silicon carbide, boron carbide, carbon, and combinations thereof.

12. The method as set forth in claim 1, wherein the glass or ceramic fibers are woven into fabric prior to the polymer coating removal step.

13. The method as set forth in claim 1, wherein said gas is heated to between 300 and 500° C.

14. The method as set forth in claim 13, wherein said gas is air.

15. The method as set forth in claim 1, wherein said gas is air.

16. The method as set forth in claim 1, wherein said glass or ceramic fibers include bundled fibers provided with the polymer coating on the outer surface.

17. The method as set forth in claim 16, wherein said bundled fibers are provided with a subsequent interface coating after having the polymer coating removed.

18. The method as set forth in claim 17, wherein said subsequent interface coating is provided by a chemical vapor deposition process.

19. The method as set forth in claim 17, wherein said subsequent interface coating includes at least one inner layer and an outer layer.

20. The method as set forth in claim 1, wherein said coated fibers are utilized to form a component for a gas turbine engine.

* * * * *